US008811527B2

(12) United States Patent
Diao et al.

(10) Patent No.: US 8,811,527 B2
(45) Date of Patent: Aug. 19, 2014

(54) ULTRA-WIDEBAND IMPULSE RADIO TRANSMITTER WITH MODULATION

(75) Inventors: Shengxi Diao, Singapore (SG); Yuanjin Zheng, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 88 days.

(21) Appl. No.: 13/503,794

(22) PCT Filed: Oct. 30, 2009

(86) PCT No.: PCT/SG2009/000397
§ 371 (c)(1),
(2), (4) Date: Oct. 8, 2012

(87) PCT Pub. No.: WO2011/053243
PCT Pub. Date: May 5, 2011

(65) Prior Publication Data
US 2013/0022086 A1    Jan. 24, 2013

(51) Int. Cl.
*H04L 27/00* (2006.01)

(52) U.S. Cl.
USPC .............................. 375/295; 375/146; 455/118

(58) Field of Classification Search
USPC .................. 327/231; 375/130, 146, 261, 279; 455/91, 102, 118, 126
See application file for complete search history.

(56) References Cited

U.S. PATENT DOCUMENTS

| | | | |
|---|---|---|---|
| 6,606,483 B1 | 8/2003 | Baker et al. | |
| 6,724,269 B2 | 4/2004 | Joe | |
| 7,162,213 B2 | 1/2007 | Watanabe et al. | |
| 7,245,886 B2 * | 7/2007 | Sorrells et al. | 455/118 |
| 7,301,383 B2 * | 11/2007 | Suzuki | 327/237 |
| 2007/0069790 A1 | 3/2007 | Lee et al. | |
| 2008/0291973 A1 | 11/2008 | Azakkour et al. | |
| 2010/0120377 A1 * | 5/2010 | He | 455/77 |

FOREIGN PATENT DOCUMENTS

WO    WO 2005/018093 A1    2/2005
WO    WO 2006071197 A1    7/2006

OTHER PUBLICATIONS

Wentzlof, et al., Delay-Based BPSK for Pulsed-UWB Communication, IEEE (ICASSP, 2007), 561-564.
Cavallaro, et. al, An Ultra-wideband Transmitter Based on a New Pulse Generator, IEEE Radio Frequency Integrated Circuits Symposium (RFIC, 2008), 43-46.
Diao, et al., An Ultra Low Power and High Efficiency UWB Transmitter for WPAN Applications, IEEE (ESSCICC, 2008), 334-337.
Barras, et al., Low-Power Ultra-Wideband Wavelets Generator with Fast Start-up Circuit, IEEE, Transactions on Microwave Theory and Techniques, vol. 54, No. 5 (2006), 2138-2145.
Diao, et al., A CMOS Ultra Low-Power and High Efficient UWB-IR Transmitter for WPAN Applications, IEEE Transactions on Circuits and Systems, vol. 56, No. 3 (2009), 200-204.

* cited by examiner

*Primary Examiner* — Leon-Viet Nguyen
(74) *Attorney, Agent, or Firm* — K. David Crockett, Esq.; Niky Economy Syrengelas, Esq.; Crockett & Crockett, PC

(57) ABSTRACT

A transmitter with modulation comprising a phase changing stage having a first switch and a second switch coupled t the first switch, a first transistor and a second transistor individually coupled to the each switch. The transmitter is configured to receive a phase changing signal having a first state and a second state. The first switch is configured t operate in an opposing manner to the second switch such that only the first transistor is configured to be turned on i the first state and only the second transistor is configured to be turned on in the second state upon receipt of the phase changing signal by the switches so as to achieve a change in an output phase of the transmitter when the phase changing signal switches from the first state to the second state.

20 Claims, 15 Drawing Sheets

Measured
BPSK Signal
Solid Line:
Logic "1"
Dotted Line:
Logic "0"

Reverse red
and
Compare

US 8,811,527 B2

ULTRA-WIDEBAND IMPULSE RADIO TRANSMITTER WITH MODULATION

TECHNICAL FIELD

Embodiments relate to an ultra-wideband (UWB) transmitter with modulation.

BACKGROUND

Modern applications, such as wireless body area networks, wireless sensor network, wireless personal area network may require short range wireless communication devices (for example Bluetooth, Zigbee, Wibre) which may require low power and a flexible modulation module. Conventional amplitude shift keying (ASK) modulation method may meet the power consumption requirement but the performance may be easily degraded by nonlinearity of transmission channel and channel interference. Phase shift keying (PSK) modulation method may have a good immunity to channel nonlinearity but may have other issues.

Therefore, there is a need for an, alternative modulation circuit or method to provide modulation which may be relatively low-power and low-cost.

SUMMARY

In various embodiments, a transmitter with modulation may be provided. The transmitter may include a phase changing stage configured to receive a phase changing signal, the phase changing signal including at least one first state and at least one second state different from the at least one first state. The phase changing stage may include at least one first switch; at least one second switch coupled to the at least one first switch; at least one first transistor coupled to the at least one first switch; and at least one second transistor coupled to the at least one second switch; wherein the at least one first switch may be configured to operate in an opposing manner to the at least one second switch such that only the at least one first transistor may be configured to be turned on in the at least one first state and only the at least one second transistor may be configured to be turned on in the at least one second state upon receipt of the phase changing signal by the at least one first switch and the at least one second switch so as to achieve a change in an output phase of the modulation circuit when the phase changing signal switches from the at least one first state to the at least one second state.

BRIEF DESCRIPTION OF THE DRAWINGS

In the drawings, like reference characters generally refer to the same parts throughout the different views. The drawings are not necessarily to scale, emphasis instead generally being placed upon illustrating the principles of various embodiments. In the following description, various embodiments of the invention are described with reference to the following drawings, in which.

DESCRIPTION

Figure 1:
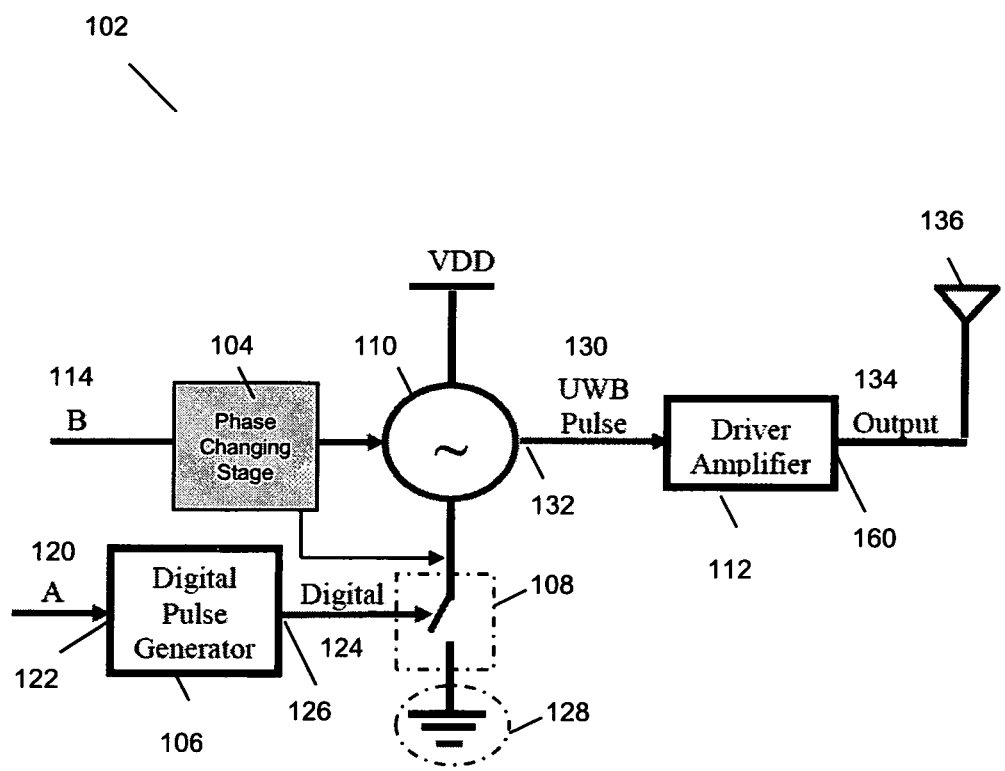
FIG. 1 shows a block diagram representation of a transmitter with Binary Phase Shift Key (BPSK) modulation according to an embodiment.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

The word "exemplary" is used herein to mean "serving as an example, instance, or illustration". Any embodiment or design described herein as "exemplary" is not necessarily to be construed as preferred or advantageous over other embodiments or designs.

In various embodiments, a low power ultra-wideband impulse radio transmitter with Binary Phase Shift Key (BPSK) or On-Off Key (OOK) modulation method may be disclosed. By using the BPSK or OOK modulation method, the transmitter may achieve low power, low cost, high bit error rate (BER) and be standard-compatible.

An embodiment may provide a transmitter with modulation. The transmitter may include a phase changing stage configured to receive a phase changing signal, the phase changing signal including at least one first state and at least one second state different from the at least one first state. The phase changing stage may include at least one first switch; at least one second switch coupled to the at least one first switch; at least one first transistor coupled to the at least one first switch; and at least one second transistor coupled to the at least one second switch; wherein the at least one first switch may be configured to operate in an opposing manner to the at least one second switch such that only the at least one first transistor may be configured to be turned on in the at least one first state and only the at least one second transistor may be configured to be turned on in the at least one second state upon receipt of the phase changing signal by the at least one first switch and the at least one second switch so as to achieve a change in an output phase of the transmitter when the phase changing signal switches from the at least one first state to the at least one second state.

In an embodiment, the phase changing signal may include a toggle signal, switching between a logic one and a logic zero. The at least one first state may include a logic one or a logic zero and the at least one second state may include a logic one or a logic zero. However, the at least one second state may be different from the at least one first state. For example, when the at least one first state may be a logic one, the at least one second state may be a logic zero and vice versa.

In an embodiment, the change in output phase of the transmitter may be about 180 degree.

In an embodiment, the transmitter may further include a pulse generator configured to receive an input pulse at a pulse generator input and to generate a digital pulse with a predetermined pulse width at a pulse generator output. The input pulse may be a toggle signal with a logic one and a logic zero. The pulse generator may be a digital pulse generator. The pulse generator may serve to generate the desired digital pulse. The pulse generator may usually allow control of the pulse repetition rate, frequency, pulse width, delay with respect to an internal or external trigger and the high- and low-voltage levels of the pulses. The pulse generator may be used to generate a narrow digital pulse of about 1 ns. The digital pulse generated by the pulse generator may determine the final UWB pulse width.

In an embodiment, the frequency of the phase changing signal is lower than the frequency of the input pulse.

In an embodiment, the transmitter may further include a third switch coupled to the pulse generator output so as to receive the digital pulse, the digital pulse may be configured to control the third switch, for example the opening or closing of the third switch.

In an embodiment, the transmitter may further include an oscillator coupled to the phase changing stage and the third switch, the oscillator may be configured to generate a UWB pulse at an oscillator output. The oscillator may be an inductor-capacitor voltage controlled oscillator (LC VCO) or a relaxation oscillator.

In an embodiment, the transmitter may further include an amplifier coupled to the oscillator so as to receive the UWB pulse, the amplifier may be configured to amplify the UWB pulse so as to generate an output pulse at an amplifier output to be transmitted.

In an embodiment, the oscillator may be further coupled to a voltage supply. The voltage supply may include a value in the range of between about 1V to about 5V, for example between about 3V to about 4V. The voltage supply may be process-dependent.

In an embodiment, the output pulse at the amplifier output may be transmitted to an antenna.

In an embodiment, the at least one first switch may include a pass gate or a transmission gate. The at least one first switch may also include a swap circuit.

In an embodiment, the at least one second switch may include a pass gate or a transmission gate. The at least one second switch may also include a swap circuit.

In an embodiment, the pulse generator may include at least one delay element and at least one logic gate. The pulse generator may be implemented in any other suitable manner.

In an embodiment, the at least one delay element may include a variable gain amplifier.

In an embodiment, the at least one logic gate may include an AND gate.

In an embodiment, the predetermined pulse width may be configured to vary with number of the at least one delay element. The predetermined pulse width may depend on the number of the delay element, on the delay time provided by each stage. For example, each stage may provide a 1 ns delay or each stage may provide a 4 ns delay, which may then be the equivalent of 4 stages, each stage with a 1 ns delay.

In an embodiment, the third switch may include at least one third transistor. The at least one third transistor may be a metal-oxide-semiconductor field-effect transistor (MOSFET), for example an n-type MOSFET (NMOS) or a p-type MOSFET (PMOS). The third switch may include any other circuits for example timing control or local oscillator depending on design and user requirements.

In an embodiment, the oscillator may include an inductor-capacitor (LC) tank stage and an oscillator core stage. The LC tank stage and the oscillator core stage may be used to generate an expected center frequency. It may be like the carrier in the narrow band system.

In an embodiment, the inductor-capacitor tank stage may include at least one first inductor, at least one second inductor, at least one first tunable capacitor and at least one second tunable capacitor. The values of each of the at least one first inductor, at least one second inductor, at least one first tunable capacitor and at least one second tunable capacitor may vary depending on user and design requirements.

In an embodiment, the oscillator core stage may include at least one fourth transistor and at least one fifth transistor. Each of the at least one fourth transistor and the at least one fifth transistor may be a metal-oxide-semiconductor field-effect transistor (MOSFET), for example an n-type MOSFET (NMOS) or a p-type MOSFET (PMOS).

In an embodiment, the amplifier may include at least one sixth transistor, at least one seventh transistor, at least one third inductor and at least one fourth inductor. Each of the at least one sixth transistor and the at least one seventh transistor may be a metal-oxide-semiconductor field-effect transistor (MOSFET), for example an n-type MOSFET (NMOS) or a p-type MOSFET (PMOS). The values of each of the at least one third inductor and the at least one fourth inductor may vary depending on user and design requirements.

In an embodiment, the phase changing stage may further include an inverter coupled to the at least one first switch and the at least one second switch. The inverter may be configured to change the state of the phase changing signal.

In an embodiment, a phase changing stage for a transmitter may be disclosed. The phase changing stage may include at least one first switch; at least one second switch coupled to the at least one first switch; at least one first transistor coupled to the at least one first switch; and at least one second transistor coupled to the at least one second switch; wherein the phase changing stage may be configured to receive a phase changing signal, the phase changing signal including at least one first state and at least one second state different from the at least one first state; and wherein the at least one first switch may be configured to operate in an opposing manner to the at least one second switch such that only the at least one first transistor may be configured to be turned on in the at least one first state and only the at least one second transistor may be configured to be turned on in the at least one second state upon receipt of the phase changing signal by the at least one first switch and the at least one second switch so as to achieve a change in an output phase of the transmitter when the phase changing signal switches from the at least one first state to the at least one second state.

FIG. 1 shows a block diagram representation of a transmitter 102 with BPSK modulation according to an embodiment.

The transmitter 102 may include a phase changing stage 104, a pulse generator 106, a third switch 108, an oscillator 110 and an amplifier 112.

The phase changing stage 104 may be configured to receive a phase changing signal 114 ("B"), the phase changing signal 114 may include at least one first state (not shown) and at least one second state (not shown) different from the at least one first state. The pulse generator 106 may be configured to receive an input pulse 120 ("A") at a pulse generator input 122 and to generate a digital pulse 124 with a predetermined pulse width at a pulse generator output 126. The third switch 108 may be coupled to the pulse generator output 126 so as to receive the digital pulse 124, the digital pulse 124 may be configured to control the third switch 108. The third switch 108 may also be coupled to a ground connection 128. The oscillator 110 may be coupled to the phase changing stage 104 and the third switch 108 and the oscillator 110 may be configured to generate a UWB pulse 130 at an oscillator output 132. The oscillator 110 may be further coupled to a voltage supply (VDD). The amplifier 112 may be coupled to the oscillator 110 so as to receive the UWB pulse 130 and the amplifier 112 may be configured to amplify the UWB pulse 130 so as to generate an output pulse 134 at an amplifier output 160 to be transmitted. The output pulse 134 at the amplifier output 160 may be transmitted to an antenna 136.

In an embodiment, for OOK modulation, data input may be through the pulse generator input 122 and the input pulse 120 to the pulse generator 106 may be a return to zero (RZ) data. The phase changing signal 114 may be set to either a logic one (high) or a logic zero (low).

For BPSK modulation, data input may be through the phase changing stage 104 instead of the pulse generator 106.

The input pulse 120 to the pulse generator 106 may be a clock signal with a predetermined frequency F. The phase changing signal 114 may be a non-return to zero (NRZ) data with a frequency about half or lower than half of the clock signal (i.e. F/2).

Figure 2:
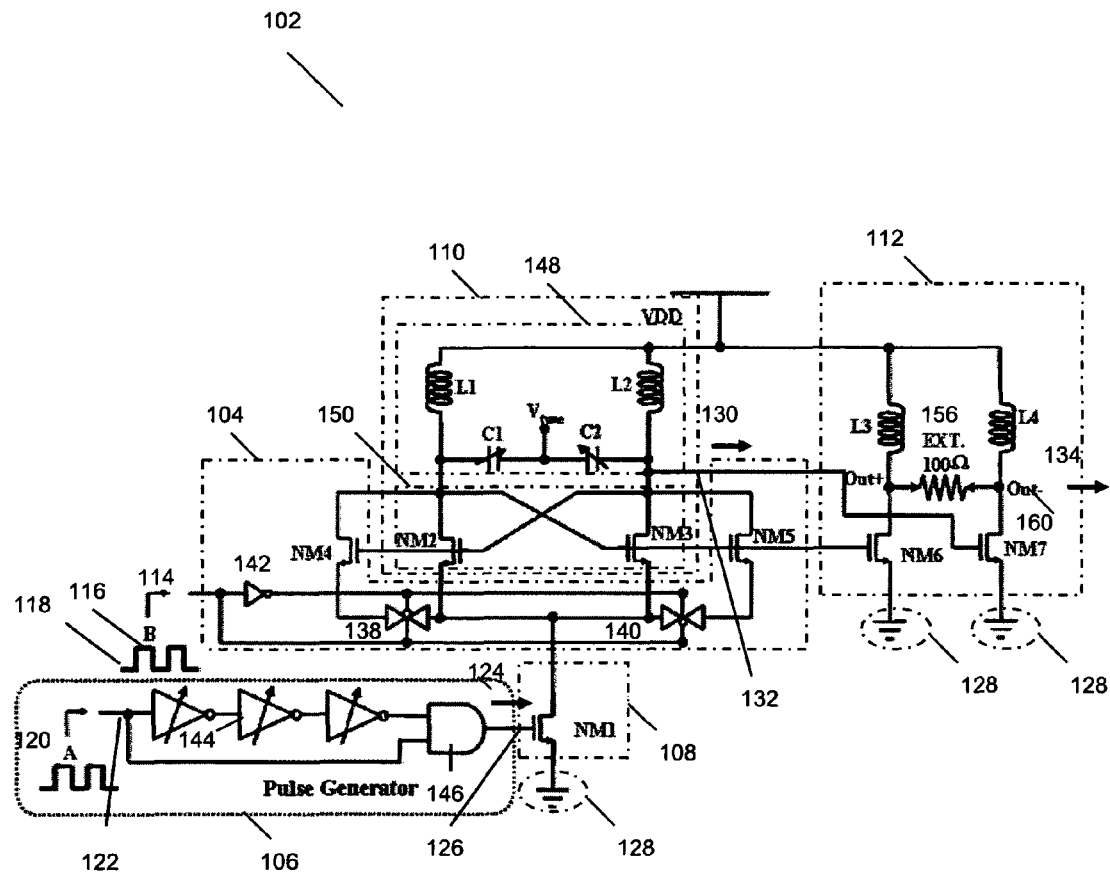
FIG. 2 shows a circuit diagram representation of a transmitter with BPSK modulation according to an embodiment.

FIG. 2 shows a circuit diagram representation of a transmitter 102 with BPSK modulation according to an embodiment.

The transmitter 102 may include a phase changing stage 104 configured to receive a phase changing signal 114 ("B"), the phase changing signal 114 including at least one first state 116 and at least one second state 118 different from the at least one first state 116. The phase changing stage 104 may include at least one first switch 138; at least one second switch 140 coupled to the at least one first switch 138; at least one first transistor (NM4) coupled to the at least one first switch 138; and at least one second transistor (NM5) coupled to the at least one second switch 140; wherein the at least one first switch 138 may be configured or arranged to operate in an opposing manner to the at least one second switch 140 such that only the at least one first transistor (NM4) may be configured to be turned on in the at least one first state 116 and only the at least one second transistor (NM5) may be configured to be turned on in the at least one second state 118 upon receipt of the phase changing signal 114 by the at least one first switch 138 and the at least one second switch 140 so as to achieve a change in an output phase of the transmitter 102 when the phase changing signal 114 switches from the at least one first state 116 to the at least one second state 118. The phase changing stage 104 may further include an inverter 142 coupled to the at least one first switch 138 and the at least one second switch 140. The at least one first transistor (NM4) and the at least one second transistor (NM5) may be used to control the output phase of the transmitter 102.

Each of the at least one first state 116 and the at least one second state 118 may be a logic one or a logic zero. However, the at least one second state 118 may be different from the at least one first state 116. For example, when the at least one first state 116 includes a logic one, the at least one second state 118 includes a logic zero and vice versa.

The at least one first switch 138 may include a pass gate or a transmission gate and the at least one second switch 140 may also include a pass gate or a transmission gate. A pass gate, a transmission gate, or an analog switch, may be defined as an electronic element that may selectively block or pass a signal level from an input to an output. The pass gate may include a PMOS transistor and an NMOS transistor. The control gates may be biased in a complementary manner so that both PMOS and NMOS transistors may be either turned on or off.

The transmitter 102 may further include a pulse generator 106 configured to receive an input pulse 120 ("A") at a pulse generator input 122 and to generate a digital pulse 124 with a predetermined pulse width at a pulse generator output 126. The pulse generator 106 may include three delay elements 144 and a logic gate 146. Each of the three delay elements 144 may include a variable gain amplifier and the logic gate 146 may include an AND gate. The predetermined pulse width of the digital pulse 124 may be configured to vary with number of the delay element 144.

The transmitter 102 may further include a third switch 108 coupled to the pulse generator output 126 so as to receive the digital pulse 124, the digital pulse 124 may be configured to control the third switch 108. The third switch 108 may include a third transistor (NM1). The third transistor (NM1) may include a metal-oxide-semiconductor field-effect transistor (MOSFET), for example an n-type MOSFET (NMOS)

or a p-type MOSFET (PMOS). The third switch 108 may be further coupled to a ground connection 128.

The transmitter 102 may further include an oscillator 110 coupled to the phase changing stage 104 and the third switch 108, the oscillator 110 may be configured to generate a UWB pulse 130 at an oscillator output 132. The oscillator 110 may include an inductor-capacitor tank stage 148 and an oscillator core stage 150. The inductor-capacitor tank stage 148 may include at least one first inductor (L1), at least one second inductor (L2), at least one first tunable capacitor (C1) and at least one second tunable capacitor (C2). The at least one first tunable capacitor (C1) and the at least one second tunable capacitor (C2) may be coupled to a tuning voltage (Vtune) positioned between the at least one first tunable capacitor (C1) and the at least one second tunable capacitor (C2). The oscillator core stage 150 may include at least one fourth transistor (NM2) and at least one fifth transistor (NM3) arranged in a cross-coupled arrangement. Each of the at least one fourth transistor (NM2) and at least one fifth transistor (NM3) may include an NMOS or a PMOS depending on user and design requirements. The oscillator 110 may be further coupled to a voltage supply (VDD).

Each of the at least one first inductor (L1) and the at least one second inductor (L2) may include an inductance value in the range of between about 0.1 nH to about 5 nH, for example about 1 nH. Each of the at least one first tunable capacitor (C1) and the at least one second tunable capacitor (C2) may include a capacitance value in the range of between about 0.1 pF to about 5 pF, for example about 1 pF. Each of the at least one first tunable capacitor (C1) and the at least one second tunable capacitor (C2) may include an accumulation-MOS varactor which may achieve a tuning range of about 1 GHz for calibration purpose.

In order to facilitate fast start-up and high output peak power, sizing of the at least one first transistor (NM4), the at least one second transistor (NM5), the at least one fourth transistor (NM2) and the at least one fifth transistor (NM3) may be relatively big. In view of this, the parasitic capacitance may be rather big around 0.6 pF.

The transmitter 102 may further include an amplifier 112 coupled to the oscillator 110 so as to receive the UWB pulse 130, the amplifier 112 may be configured to amplify the UWB pulse 130 so as to generate an output pulse 134 at an amplifier output 160 to be transmitted. The output pulse 134 at the amplifier output 160 may be transmitted to an antenna (not shown). The amplifier 112 may include at least one sixth transistor (NM6), at least one seventh transistor (NM7), at least one third inductor (L3) and at least one fourth inductor (L4). Each of the at least one third inductor (L3) and the at least one fourth inductor (L4) may include an inductance value in the range of between about 0.1 nH to about 5 nH, for example about 1.5 nH. The amplifier 112 may form a buffer and may be used to drive about 100Ω loading and to stabilize the frequency of the oscillator 110. The output pulse 134 may be a differential output pulse 134. A resistor 156 with a resistance of about 100Ω may be positioned between the respective different outputs. The amplifier 112 may be switched on and off simultaneously with the oscillator 110 through a gate bias (not shown). The switching on and off of the amplifier 112 may be used to save the power consumption. From FIG. 2, one can see that if the at least one sixth transistor (NM6) and the at least one seventh transistor (NM7) are always on, the power consumption may be very big. Therefore, the at least one sixth transistor (NM6) and the at least one seventh transistor (NM7) may only be turned on when there may be an UWB pulse 130.

In an embodiment, the operation of the transmitter 102 may be as shown. The operation may be based on the example when the phase changing signal 114 may be a logic one, which may mean that the at least one first transistor (NM4) may be on and the at least one second transistor (NM5) may be off.

When the at least one third transistor (NM1) may be off, there may be no current flowing through the at least one first transistor (NM4), the at least one second transistor (NM5), the at least one fourth transistor (NM2) and the at least one fifth transistor (NM3).

Then one may assume that $V_{ds2} = V_{ds3}$. Equation (1)

When the at least one third transistor (NM1) may be on, since the at least one first transistor (NM4) may be on and the at least one second transistor (NM5) may be off, the transistor width of the left branch may be an addition of $W_4 + W_2$ and the width of right branch may be $W_3$. Therefore, one may have $$I_{left} = \frac{1}{2} \frac{W_2 + W_4}{L} \mu_n C_{ox} (V_{right} - V_{th})^2 \quad \text{Equation (2)}$$

$$I_{right} = \frac{1}{2} \frac{W_3}{L} \mu_n C_{ox} (V_{left} - V_{th})^2 \quad \text{Equation (3)}$$

$$W_2 = W_3 \Rightarrow I_{left} - I_{right} = \frac{1}{2} \frac{W_4}{L} \mu_n C_{ox} (V_{right} - V_{th})^2 \quad \text{Equation (4)}$$

$$L_1 = L_2 \Rightarrow R_{sr1} = R_{sr2} \quad \text{Equation (5)}$$

($R_{sr}$ is the parasitic resistance of inductor)

So the voltage drop difference on the two inductors is:

$$V_{L1} - V_{L2} = \frac{1}{2} R_{sr1} \frac{W_4}{L} \mu_n C_{ox} (V_{right} - V_{th})^2 \quad \text{Equation (6)}$$

$$\because V_{L1} + V_{DS2} = V_{L2} + V_{DS3} \quad \text{Equation (7)}$$

$$\therefore V_{DS2} - V_{DS3} = -\frac{1}{2} R_{sr1} \frac{W_4}{L} \mu_n C_{ox} (V_{right} - V_{th})^2 \quad \text{Equation (8)}$$

We assume the loop gain may be:

$$A_v = (g_{m24} Z_1)(g_{m3} Z_2) = (g_{m2} Z_1)(g_{m35} Z_2)$$

(here $g_{m24} = g_{m35}$ and $g_{m3} = g_{m2}$)

$$A_v = \text{real}(|A| \angle \theta) \quad \text{Equation (9)}$$

Therefore, the final output (assume buffer gain may be $A_1$) may be:

$$V_+ - V_- = \text{Real}((V_{ds2} - V_{ds3}) A_v A_1) \quad \text{Equation (10)}$$

$$= -\frac{1}{2} R_{sr1} \frac{W_4}{L} \mu_n C_{ox} (V_{right} - V_{th})^2 |A| A_1 \text{real}(\angle \theta)$$

When the phase changing signal 114 may be a logic 0, which may mean that $V_{ds4}$ may be off and $V_{ds5}$ may be on. One may have:

$$V_+ - V_- = -\frac{1}{2}R_{sr1}\frac{-W_5}{L}\mu_n C_{ox}(V_{right} - V_{th})^2|A|A_1\mathrm{real}(\angle\theta)$$

$$= \frac{1}{2}R_{sr1}\frac{W_5}{L}\mu_n C_{ox}(V_{right} - V_{th})^2|A|A_1\mathrm{real}(\angle\theta)$$

Equation (11)

Since $W_4=W_5$, the respective final output may be 180 degree phase difference between both cases when the phase changing signal 114 may be a logic 1 and a logic 0. The imbalance may lead to the BPSK modulation.

Figure 3:
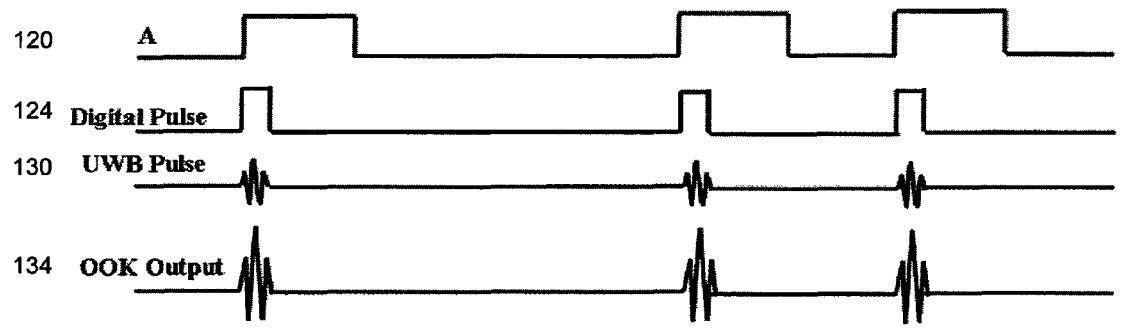
FIG. 3 shows respective waveforms of a transmitter when operating in On-Off Key (OOK) modulation mode according to an embodiment.

FIG. 3 shows respective waveforms of a transmitter 102 when operating in On-Off Key (OOK) modulation mode according to an embodiment.

When the transmitter 102 may operate in OOK modulation mode, the rising edge of the input pulse 120 ("A") may trigger the pulse generator 106 to generate a nano-second wide digital pulse 124. The digital pulse 124 train may control the tail current source of the oscillator 110 and consequently an UWB pulse 130 train may be generated. After amplification by the amplifier 112, the output pulse 134 may be sent to a matched antenna 136.

Figure 4:
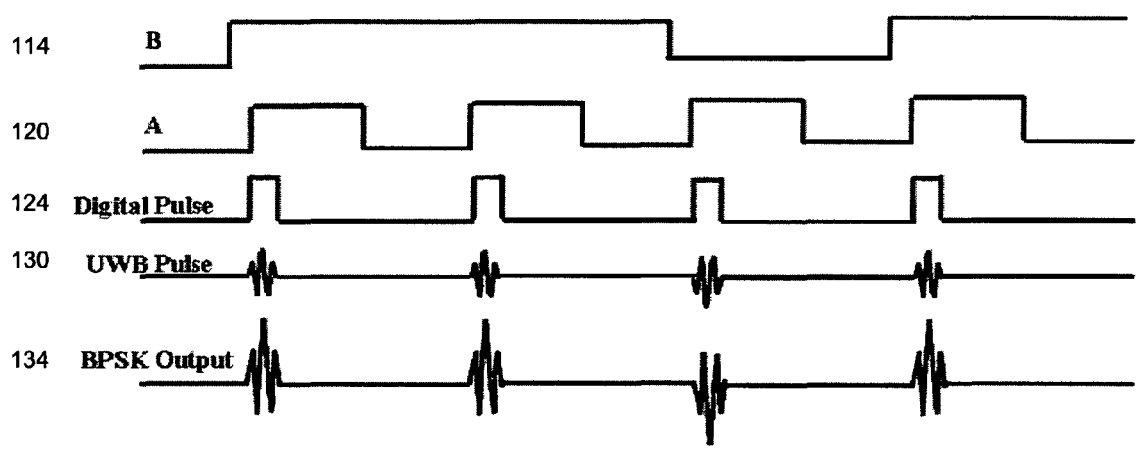
FIG. 4 shows respective waveforms of a transmitter when operating in BPSK modulation mode according to an embodiment.

FIG. 4 shows respective waveforms of a transmitter 102 when operating in BPSK modulation mode according to an embodiment.

When the transmitter 102 may operate in BPSK modulation mode, the rising edge of input pulse 120 ("A") may trigger the pulse generator 106 to generate a nano-second wide digital pulse 124. As the input pulse 120 ("A") may include a clock signal with a frequency F, that may mean that there may be a digital pulse 124 at each clock. Consequently, a UBM pulse 130 may be generated. After amplification, the phase of the output pulse 134 may be modulated by the NRZ phase changing signal 114 ("B").

For example, when the at least one first transistor (NM4) may be on and the at least one second transistor (NM5) may be off, an imbalance may be introduced to the oscillator 110 and the oscillation may start from one side. When the at least one first transistor (NM4) may be off and the at least one second transistor (NM5) may be on, the oscillation may start from the other side. As shown in FIG. 4, there may be about 180 degree difference in the output phase of the transmitter 102 between the phase changing signal 114 with a logic 1 (input high) and the phase changing signal 114 with a logic 0 (input low).

Figure 5:
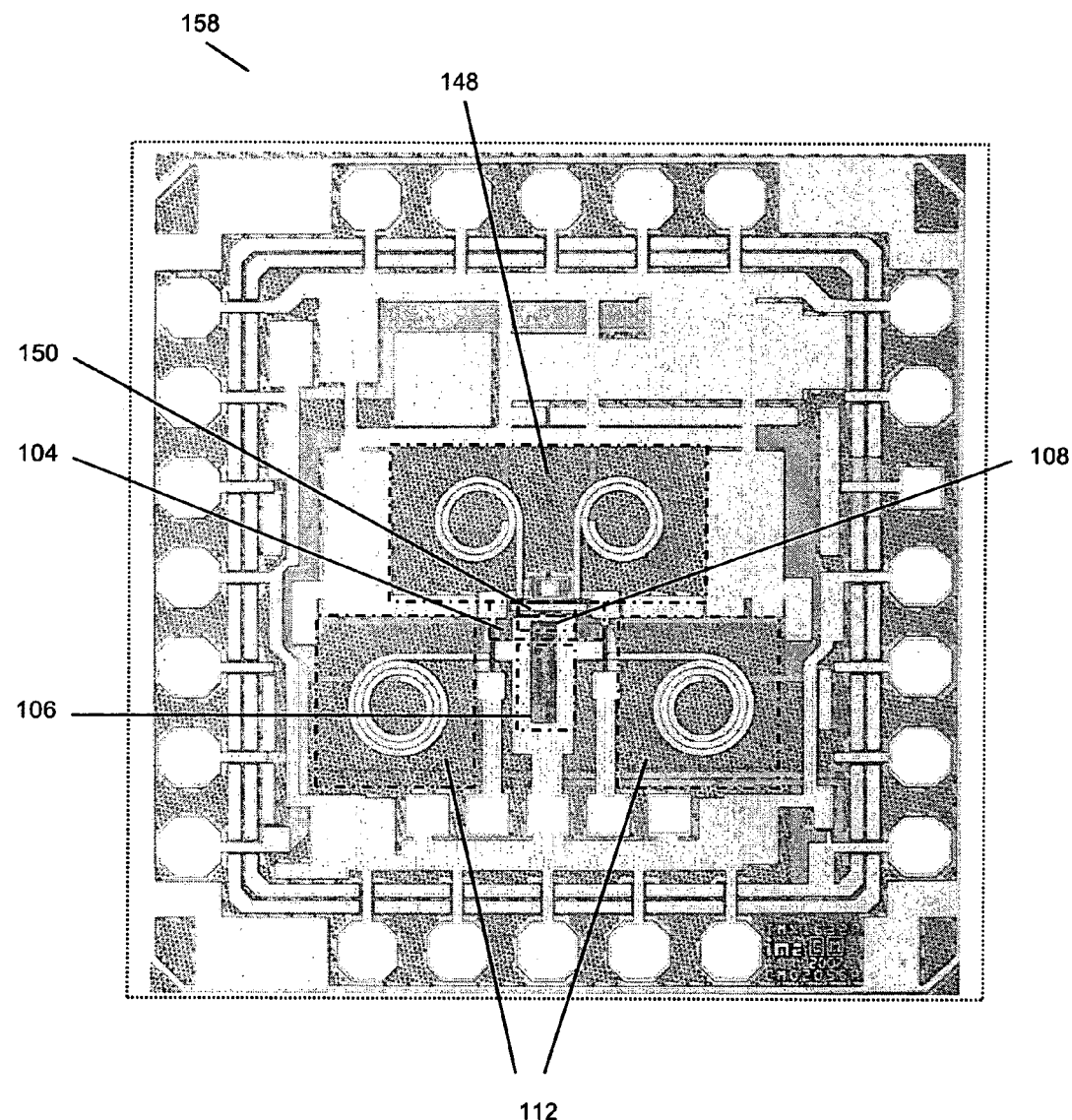
FIG. 5 shows a chip photo of a transmitter with BPSK modulation according to an embodiment.

FIG. 5 shows a chip photo 158 of a transmitter 102 with BPSK modulation according to an embodiment.

The chip photo 158 shows the transmitter 102 including a phase changing stage 104, a pulse generator 106, a third switch 108, an amplifier 112, an inductor-capacitor tank stage 148 and an oscillator core stage 150.

Figure 6:
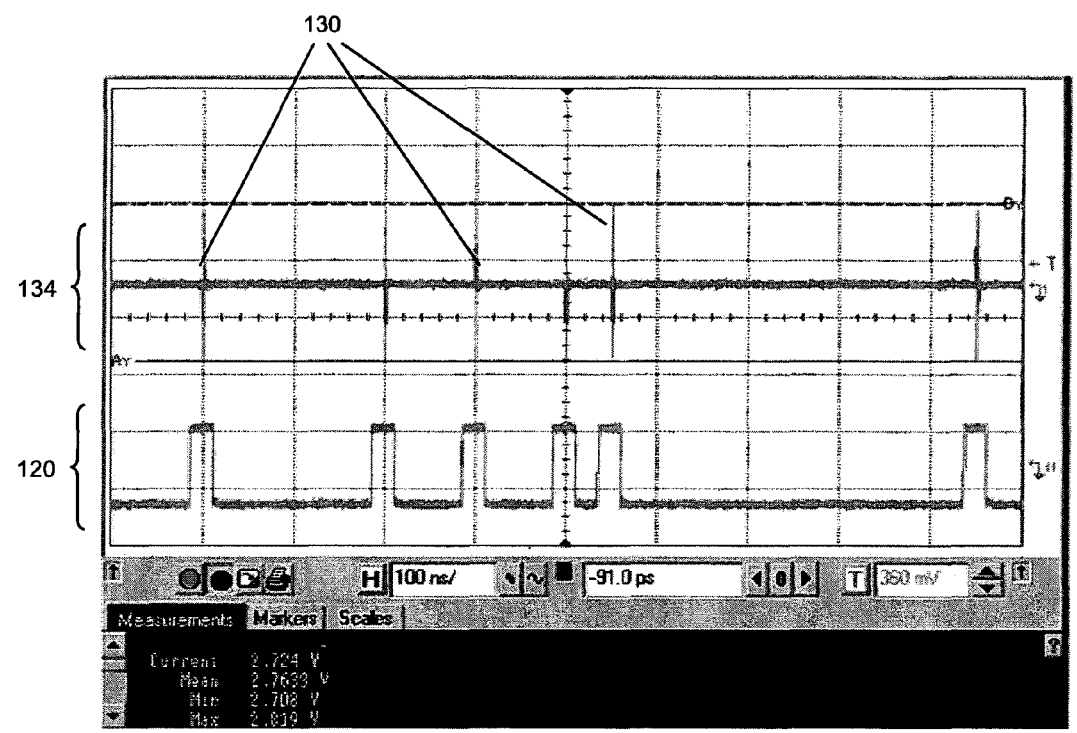
FIG. 6 shows an output pulse and an input pulse in time-domain of a transmitter when operating in OOK modulation mode according to an embodiment.

FIG. 6 shows an output pulse 134 and an input pulse 120 in time-domain of a transmitter 102 when operating in OOK modulation mode according to an embodiment.

When the transmitter 102 may be operating in OOK modulation mode, an input data may be the input pulse 120 ("A") and the phase changing signal 114 ("B") (not shown in FIG. 6) may be set to a fixed value logic one or zero. The input pulse 120 ("A") may toggle between a logic one and a logic zero.

For OOK modulation mode, when the input pulse 120 may be a logic one, there may be a UWB pulse 130 and when the input pulse 120 may be a logic zero, there may not be any UWB pulse 130.

Figure 7:
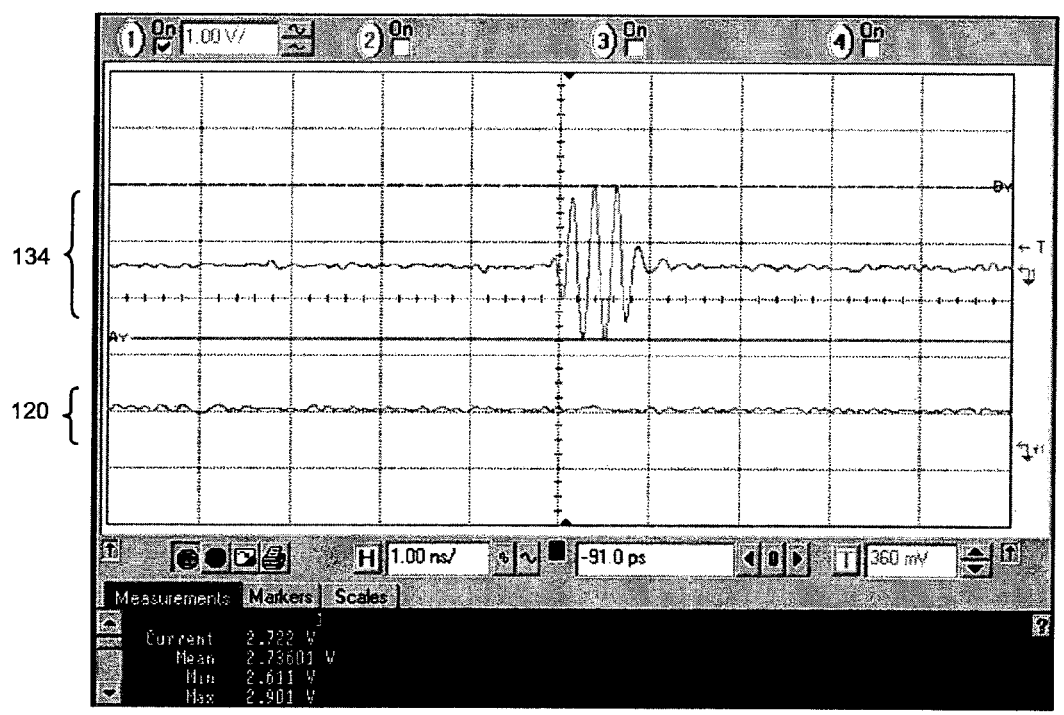
FIG. 7 shows a zoomed-in view of the output pulse and the input pulse as shown in FIG. 6 in time-domain of a transmitter when operating in OOK modulation mode with the input pulse being a logic one according to an embodiment.

FIG. 7 shows a zoomed-in view of the output pulse 134 and the input pulse 120 as shown in FIG. 6 in time-domain of a transmitter 102 when operating in OOK modulation mode with the input pulse 120 being a logic one according to an embodiment.

Figure 8:
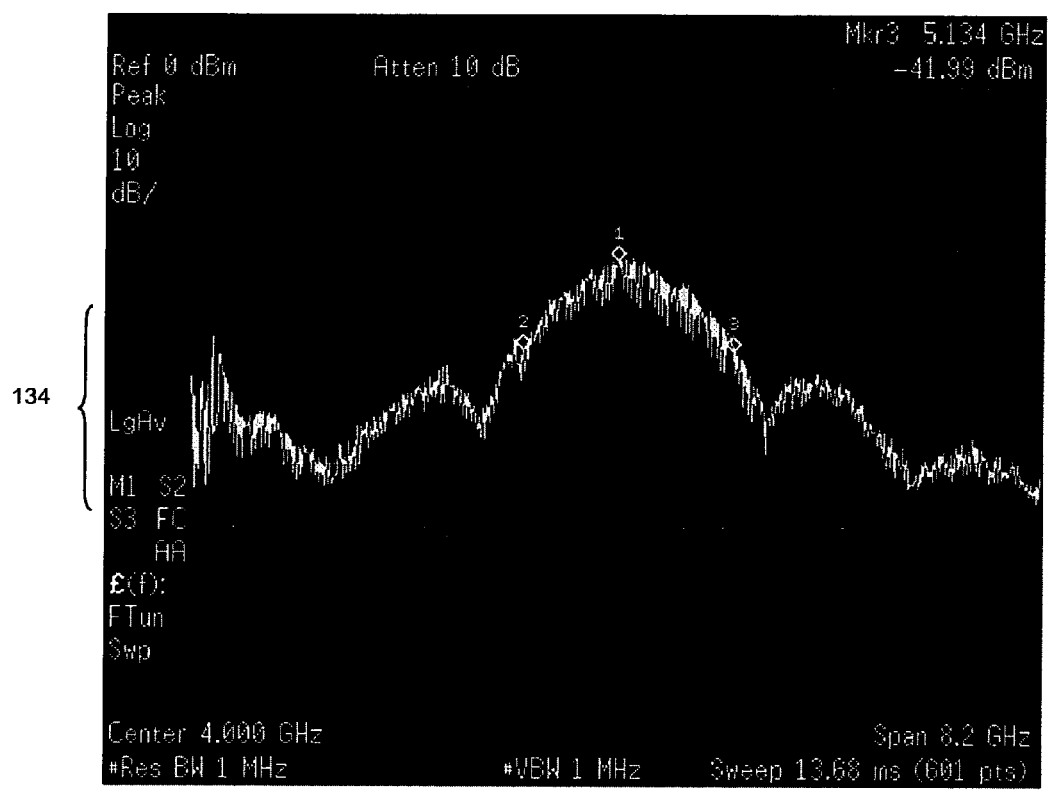
FIG. 8 shows an output pulse in frequency-domain of a transmitter when operating in OOK modulation mode according to an embodiment.

FIG. 8 shows an output pulse 134 in frequency-domain of a transmitter 102 when operating in OOK modulation mode according to an embodiment.

Figure 9A:
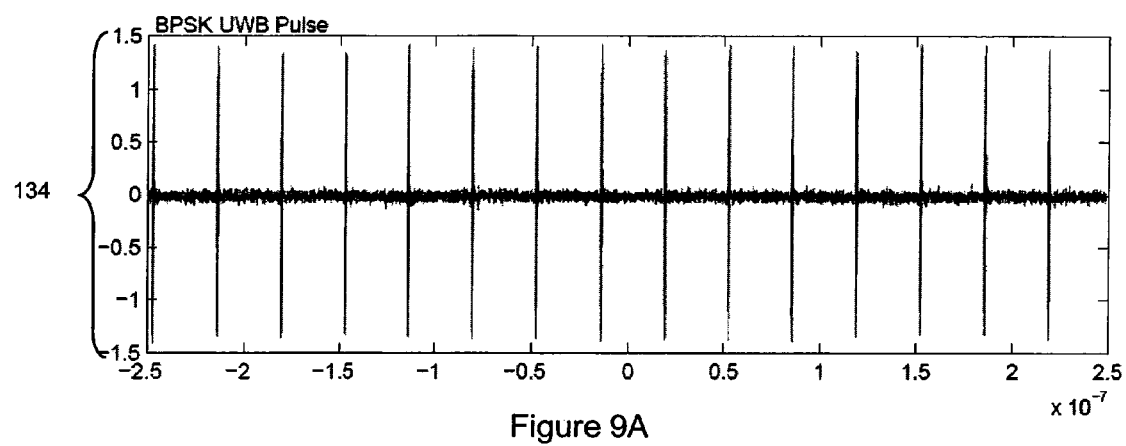
FIG. 9A shows an output pulse of a transmitter when operating in BPSK modulation mode according to an embodiment.
Figure 9B:
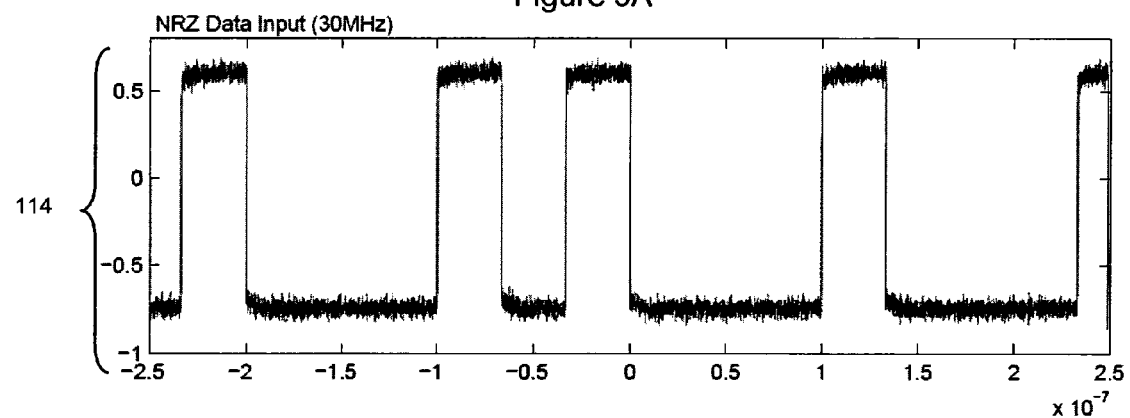
FIG. 9B shows a phase changing signal of a transmitter when operating in BPSK modulation mode with a frequency of about 30 MHz according to an embodiment.

FIG. 9A shows an output pulse 134 of a transmitter 102 when operating in BPSK modulation mode according to an embodiment. FIG. 9B shows a phase changing signal 114 of a transmitter 102 when operating in BPSK modulation mode with a frequency of about 30 MHz according to an embodiment.

When the transmitter 102 may be operating in BPSK modulation mode, an input data may be the phase changing signal 114 ("B") and the input pulse 120 ("A") (not shown) may function as a clock.

Figure 10A:
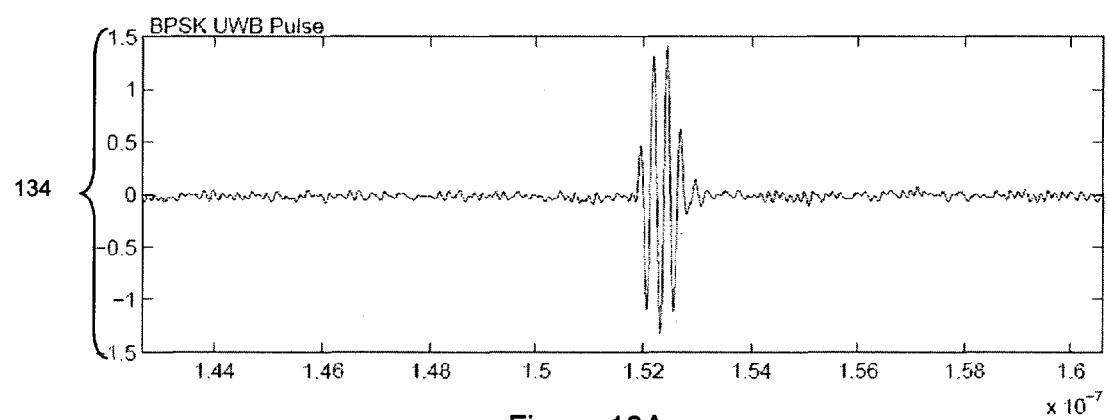
FIG. 10A shows a zoomed-in view of the output pulse as shown in FIG. 9A of the transmitter when operating in BPSK modulation mode with a phase changing signal being a logic zero according to an embodiment.
Figure 10B:
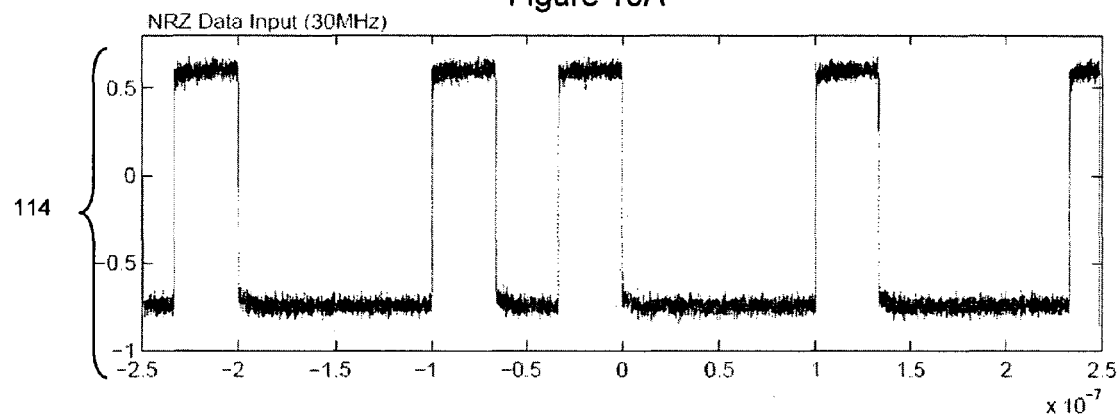
FIG. 10B shows the phase changing signal of the transmitter when operating in BPSK modulation mode with a frequency of about 30 MHz according to an embodiment.

FIG. 10A shows a zoomed-in view of the output pulse 134 as shown in FIG. 9A of the transmitter 102 when operating in BPSK modulation mode with a phase changing signal 114 being a logic zero according to an embodiment. FIG. 10B shows the phase changing signal 114 of the transmitter 102 when operating in BPSK modulation mode with a frequency of about 30 MHz according to an embodiment.

Figure 11A:
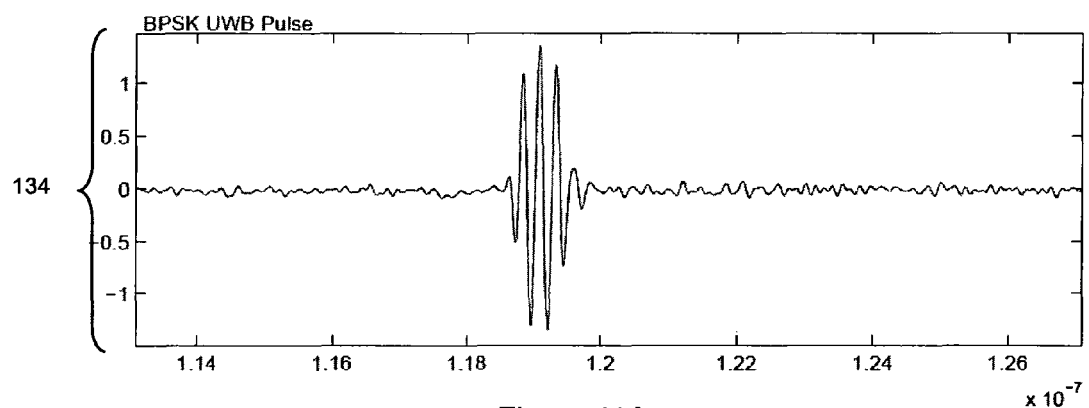
FIG. 11A shows a zoomed-in view of the output pulse as shown in FIG. 9A of the transmitter when operating in BPSK modulation mode with a phase changing signal being a logic one according to an embodiment.
Figure 11B:
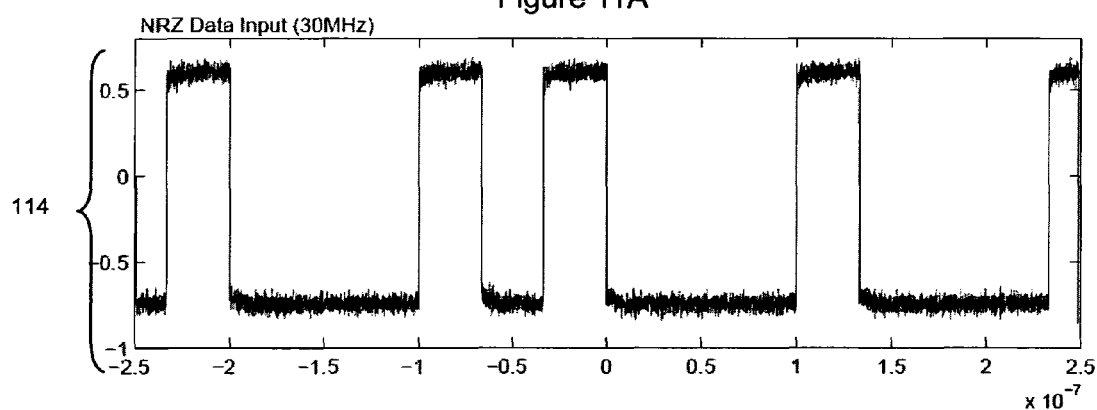
FIG. 11B shows a phase changing signal of the transmitter when operating in BPSK modulation mode with a frequency of about 30 MHz according to an embodiment.

FIG. 11A shows a zoomed-in view of the output pulse 134 as shown in FIG. 9A of the transmitter 102 when operating in BPSK modulation mode with a phase changing signal 114 being a logic one according to an embodiment. FIG. 11B shows a phase changing signal 114 of the transmitter 102 when operating in BPSK modulation mode with a frequency of about 30 MHz according to an embodiment.

Figure 12:
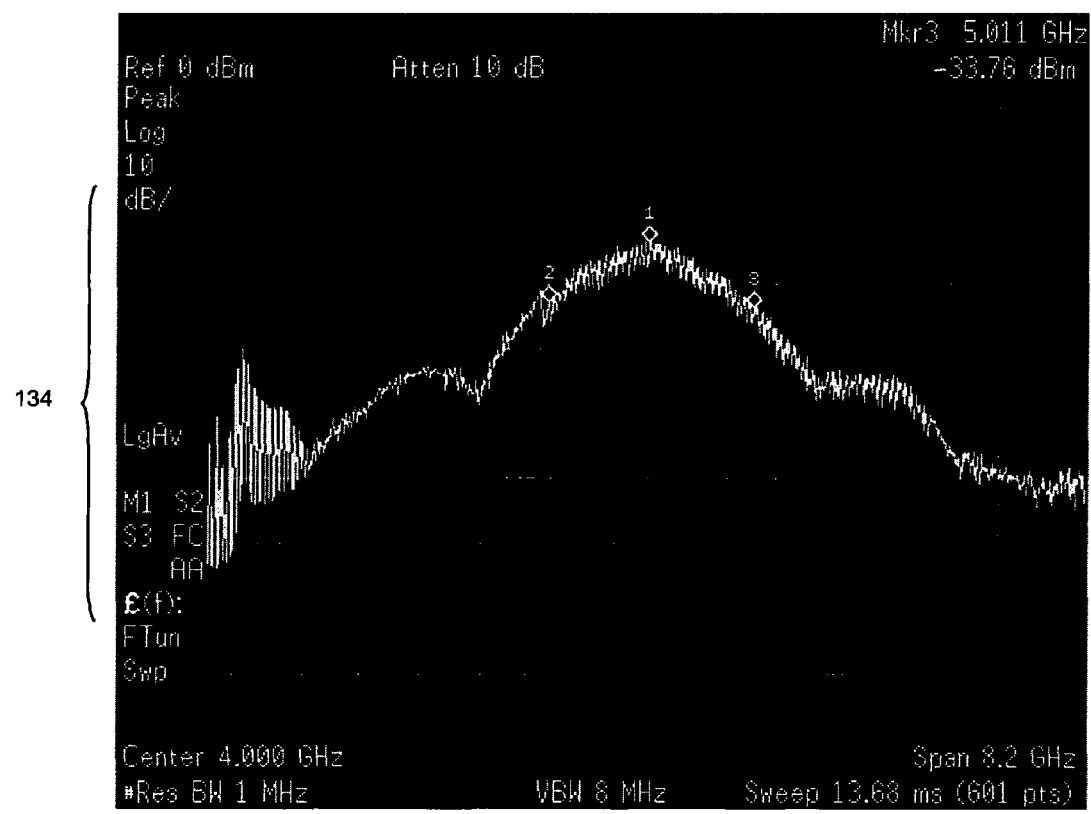
FIG. 12 shows an output pulse in frequency-domain of a transmitter when operating in BPSK modulation mode according to an embodiment.

FIG. 12 shows an output pulse 134 in frequency-domain of a transmitter 102 when operating in BPSK modulation mode according to an embodiment.

Figure 13A:
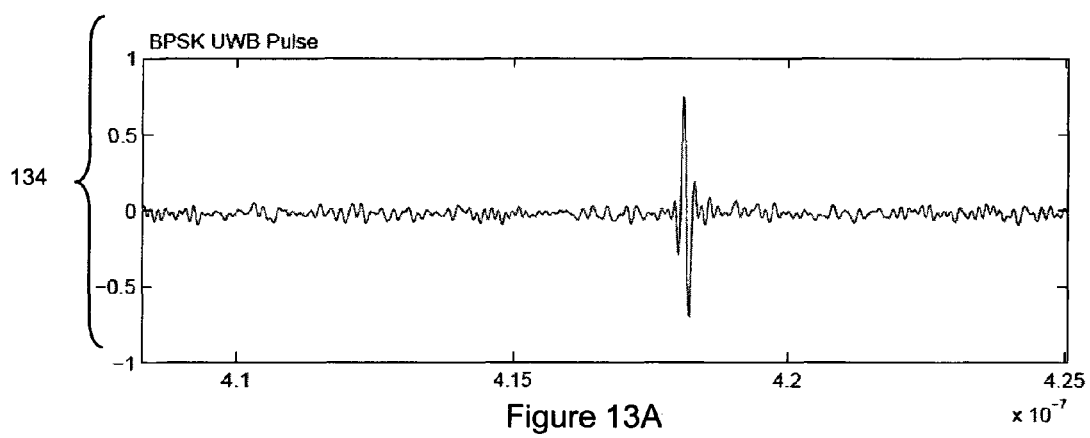
FIG. 13A shows an output pulse of a transmitter when operating in BPSK modulation mode with a phase changing signal being a logic zero and when a narrow digital pulse is adopted according to an embodiment.
Figure 13B:
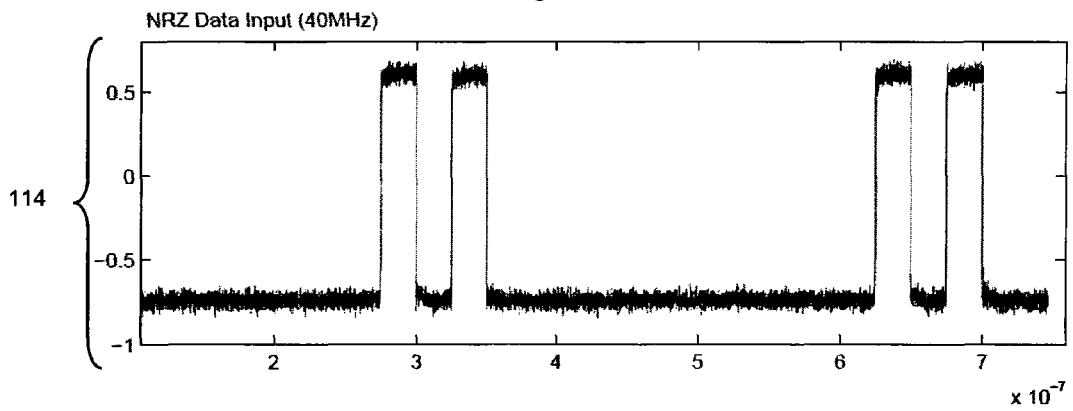
FIG. 13B shows a phase changing signal of a transmitter when operating in BPSK modulation mode with a frequency of about 40 MHz according to an embodiment.

FIG. 13A shows an output pulse 134 of a transmitter 102 when operating in BPSK modulation mode with a phase changing signal 114 being a logic zero and when a narrow digital pulse 124 is adopted according to an embodiment; FIG. 13B shows a phase changing signal 114 of a transmitter 102 when operating in BPSK modulation mode with a frequency of about 40 MHz according to an embodiment.

Figure 14A:
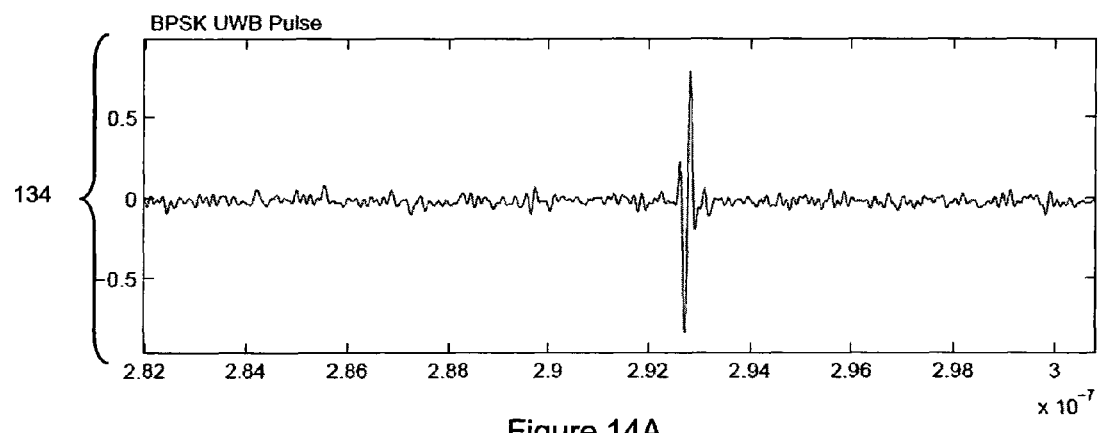
FIG. 14A shows an output pulse in frequency-domain of a transmitter when operating in BPSK modulation mode with a phase changing signal being a logic one and when a narrow digital pulse is adopted according to an embodiment.
Figure 14B:
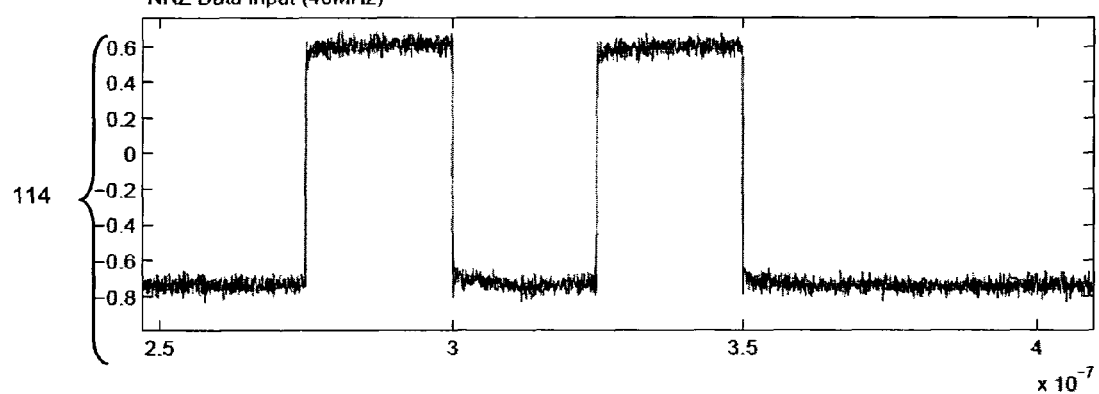
FIG. 14B shows a phase changing signal of a transmitter when operating in BPSK modulation mode with a frequency of about 40 MHz according to an embodiment.

FIG. 14A shows an output pulse 134 in frequency-domain of a transmitter 102 when operating in BPSK modulation mode with a phase changing signal 114 being a logic one and when a narrow digital pulse 124 is adopted according to an embodiment.

FIGS. 13A, 13B, 14A and 14B may help to show a clear reverse phase with the phase changing signal 114 being a logic one or a logic zero.

Further FIGS. 13A, 13B, 14A and 14B may be similar to FIGS. 10A, 10B, 11A and 11B except that a narrower digital pulse 124 may be adopted in FIGS. 13A, 13B, 14A and 14B. Therefore, the respective pulse width in FIGS. 13A and 14A may be narrower than that as shown in FIGS. 10A and 11A.

Figure 15A:
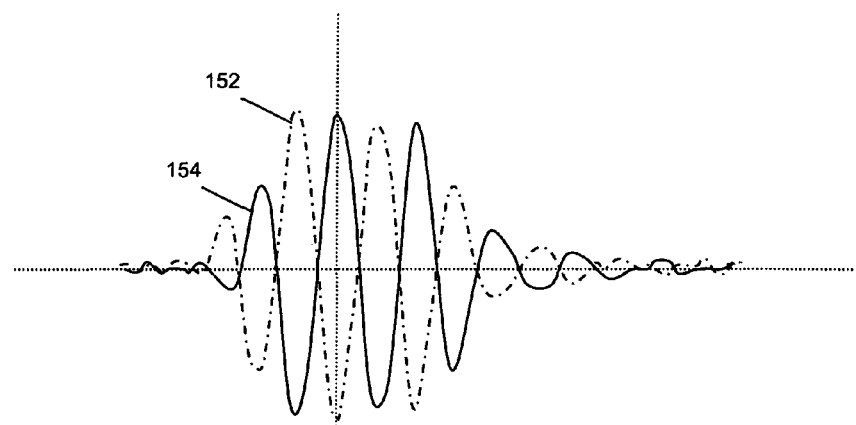
FIG. 15A shows measurements of the respective output pulses corresponding to at least one first state and at least one second state of a phase changing signal on a single plot.

FIG. 15A shows measurements of the respective first output pulse 152 and second output pulse 154 corresponding to at least one first state 116 and at least one second state 118 of a phase changing signal 114 on a single plot.

The at least one first state 116 of the phase changing signal 114 may be a logic zero and the at least one second state 118 of the phase changing signal 114 may be a logic one.

Figure 15B:
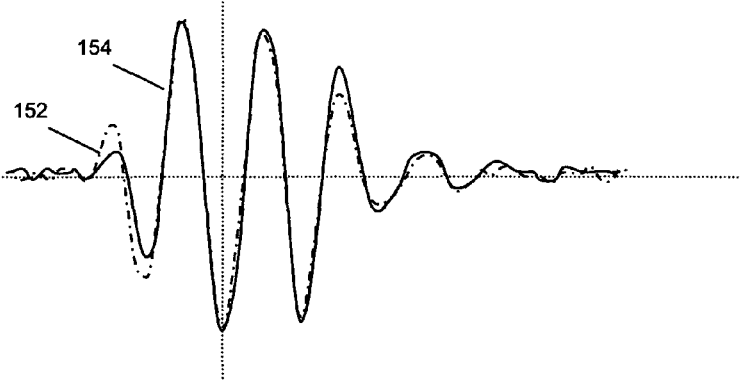
FIG. 15B shows an inversion of the output pulse corresponding to the at least one second state of the phase changing signal and subsequently being overlapped onto the output pulse corresponding to the at least one first state of the phase changing signal on a single plot according to an embodiment.

FIG. 15B shows an inversion of the second output pulse 154 corresponding to the at least one second state 118 of the phase changing signal 114 and subsequently being overlapped onto the first output pulse 152 corresponding to the at least one first state 116 of the phase changing signal 114 on a single plot according to an embodiment.

The at least one first state 116 of the phase changing signal 114 may be a logic zero and the at least one second state 118 of the phase changing signal 114 may be a logic one.

Table 1 below shows the respective measured results of the transmitter 102 in respective OOK modulation and BPSK modulation. According to the table 1, the centre frequency may be between a range of about 3.9 GHz to about 4.1 GHz. The supply voltage may be between a range of about 1.6 V to about 2 V. The total drain current may be between a range of about 126 μA to about 200 μA. The temperature may be about room temperature, between about 25° C. to 35° C. The data voltage level may be between a range of about 1V to about 1.8 V. The data rate may be between a range of about 0.1 MHz to about 30 MHz. The output voltage swing may be between a range of about 4.3 V to about 5 V. The output bandwidth may be between a range of about 0.5 GHz to about 3.5 GHz. The modulation mode may be OOK or BPSK.

TABLE I

The Measured Result of the OOK/BPSK UWB-IR Transmitter

| | Symbol | Conditions/ Remarks | Typical | Range | units |
|---|---|---|---|---|---|
| Parameter | | | | | |
| Centre Frequency | f | | 4 | 3.9~4.1 | GHz |
| Supply Voltage | $V_{DD}$ | | 1.8 | 1.6~2.0 | V |
| Total Drain Current | $I_d$ | | 150 | 126~200 | μA |
| Temperature | T | | 27 | Room temperature | °C. |
| Input/Output Characteristic | | | | | |
| Data Voltage Level | A; B | | 1.6 | 1~1.8 | V |
| Data Rate | $f_{In}$ | 50% duty cycle | 1 | 0.1~30 | MHz |
| Output voltage swing | $V_o$ | Differential output @ 100Ω | 4.5 | 4.3~5 | V |
| Output Band Width | BW | | 2 | 0.5~3.5 | GHz |
| Modulator Parameters | | | | | |
| Modulation | | | OOK/BPSK | | |

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A transmitter with modulation, comprising:
a phase changing stage configured to receive a phase changing signal, the phase changing signal including at least one first state and at least one second state different from the at least one first state;
the phase changing stage comprising
at least one first switch;
at least one second switch coupled to the at least one first switch;
at least one first transistor coupled to the at least one first switch; and
at least one second transistor coupled to the at least one second switch;
wherein the at least one first switch is configured to operate in an opposing manner to the at least one second switch such that only the at least one first transistor is configured to be turned on in the at least one first state and only the at least one second transistor is configured to be turned on in the at least one second state upon receipt of the phase changing signal by the at least one first switch and the at least one second switch so as to achieve a change in an output phase of the transmitter when the phase changing signal switches from the at least one first state to the at least one second state.

2. The transmitter of claim 1, further comprising a pulse generator configured to receive an input pulse at a pulse generator input and to generate a digital pulse with a predetermined pulse width at a pulse generator output.

3. The transmitter of claim 2, further comprising a third switch coupled to the pulse generator output so as to receive the digital pulse, the digital pulse is configured to control the third switch.

4. The transmitter of claim 3, further comprising an oscillator coupled to the phase changing stage and the third switch, the oscillator configured to generate a UWB pulse at an oscillator output.

5. The transmitter of claim 4, further comprising an amplifier coupled to the oscillator so as to receive the UWB pulse, the amplifier is configured to amplify the UWB pulse so as to generate an output pulse at an amplifier output to be transmitted.

6. The transmitter of claim 4, wherein the oscillator is further coupled to a voltage supply.

7. The transmitter of claim 5, wherein the output pulse at the amplifier output is transmitted to an antenna.

8. The transmitter of claim 1, wherein the at least one first switch comprises a pass gate.

9. The transmitter of claim 1, wherein the at least one second switch comprises a pass gate.

10. The transmitter of claim 2, wherein the pulse generator comprises at least one delay element and at least one logic gate.

11. The transmitter of claim 10, wherein the at least one delay element comprises a variable gain amplifier.

12. The transmitter of claim 10, wherein the at least one logic gate comprises an AND gate.

13. The transmitter of claim 10, wherein the predetermined pulse width is configured to vary with number of the at least one delay element.

14. The transmitter of claim 3, wherein the third switch comprises at least one third transistor.

15. The transmitter of claim 4, wherein the oscillator comprises an inductor-capacitor tank stage and an oscillator core stage.

16. The transmitter of claim 15, wherein the inductor-capacitor tank stage comprises at least one first inductor, at least one second inductor, at least one first tunable capacitor and at least one second tunable capacitor.

17. The transmitter of claim 15, wherein the oscillator core stage comprises at least one fourth transistor and at least one fifth transistor.

18. The transmitter of claim 5, wherein the amplifier comprises at least one sixth transistor, at least one seventh transistor, at least one third inductor and at least one fourth inductor.

19. The transmitter of claim 1, wherein the phase changing stage further comprises an inverter coupled to the at least one first switch and the at least one second switch.

20. A phase changing stage for a transmitter comprising:
at least one first switch;
at least one second switch coupled to the at least one first switch;
at least one first transistor coupled to the at least one first switch; and
at least one second transistor coupled to the at least one second switch;
wherein the phase changing stage is configured to receive a phase changing signal, the phase changing signal including at least one first state and at least one second state different from the at least one first state; and
wherein the at least one first switch is configured to operate in an opposing manner to the at least one second switch such that only the at least one first transistor is configured to be turned on in the at least one first state and only the at least one second transistor is configured to be turned on in the at least one second state upon receipt of the phase changing signal by the at least one first switch and the at least one second switch so as to achieve a change in an output phase of the transmitter when the phase changing signal switches from the at least one first state to the at least one second state.

\* \* \* \* \*